Figure 1:
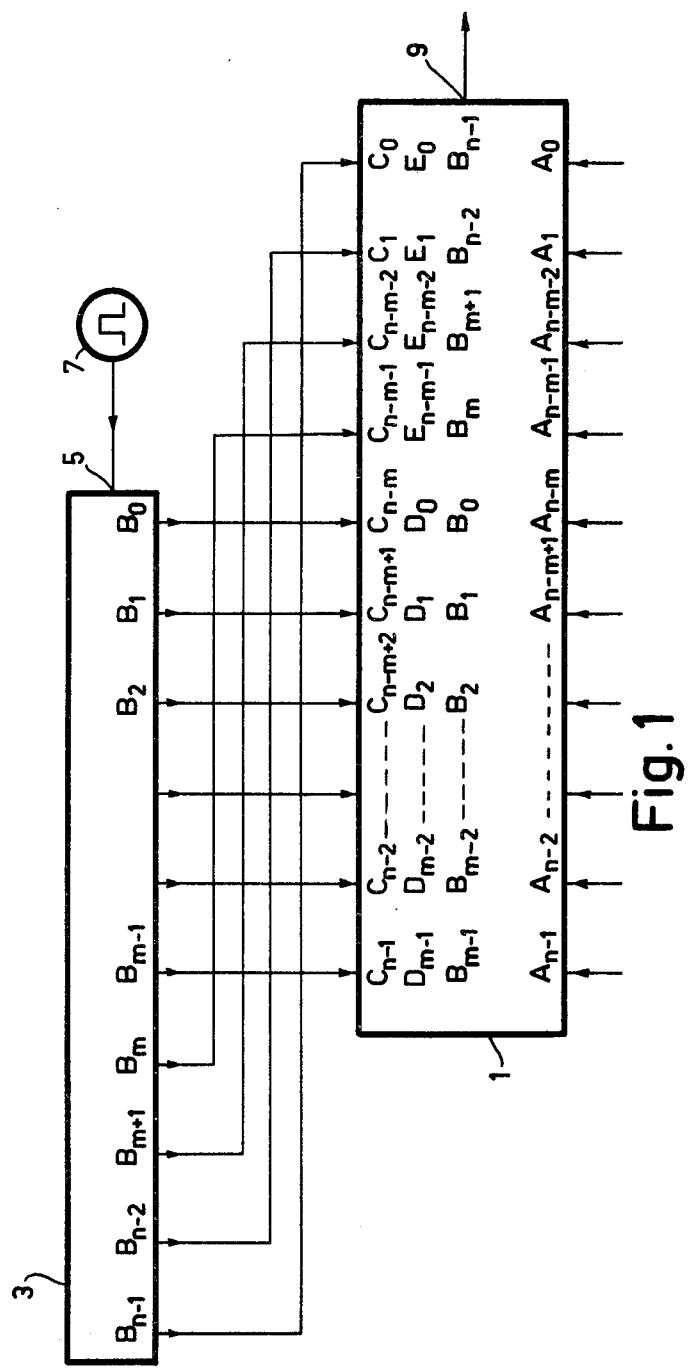

United States Patent [19]

Ong

[11] 4,096,475
[45] Jun. 20, 1978

[54] CIRCUIT FOR THE CONVERSION OF A DIGITAL SIGNAL TO AN ANALOG SIGNAL

[75] Inventor: Kian Kie Ong, Eindhoven, Netherlands

[73] Assignee: U.S. Philips Corporation, New York, N.Y.

[21] Appl. No.: 701,309

[22] Filed: Jun. 30, 1976

Related U.S. Application Data

[62] Division of Ser. No. 579,868, May 22, 1975, abandoned.

[30] Foreign Application Priority Data

Apr. 8, 1975   Netherlands ............... 7504147

[51] Int. Cl.² .......................................... H03K 13/02
[52] U.S. Cl. .......................... 340/347 DA; 325/464; 340/347 M
[58] Field of Search ............... 340/347 M, 347 DA; 325/459, 464

[56] References Cited

U.S. PATENT DOCUMENTS

| | | | |
|---|---|---|---|
| 2,894,254 | 7/1959 | Mork | 340/347 DA |
| 3,754,233 | 8/1973 | Sutherland | 340/347 DA |
| 3,836,908 | 9/1974 | Hegendorfer | 340/347 DA |
| 3,906,351 | 9/1975 | Evans | 325/464 X |

*Primary Examiner*—Thomas J. Sloyan
*Attorney, Agent, or Firm*—Frank R. Trifari; Daniel R. McGlynn; Steven R. Biren

[57] ABSTRACT

A digital-to-analog converter using a combined pulse rate and pulse width modulation of an output signal of a circuit for providing a digital signal to be converted to a periodically occurring series of digital comparison signals to be obtained by a proper choice of a particular series. The digital-to-analog converter has a very small error which, due to its low temperature sensitivity, is particularly suitable for tuning circuits of television receivers.

2 Claims, 3 Drawing Figures

CIRCUIT FOR THE CONVERSION OF A DIGITAL SIGNAL TO AN ANALOG SIGNAL

This is a division, of application Ser. No. 579,868, filed May 22, 1975, abandoned.

The invention relates to a circuit for the conversion of a digital signal to an analog signal which can be obtained from the output of a comparator, in which comparator the value of the digital signal corresponding to a digital number ($A = A_{n-1} \ldots A_O$) to be converted is compared to the value of a digital comparison signal which corresponds to a periodically occurring series of comparison numbers ($C = C_{n-1} \ldots C_O$), produced by a generator.

From the British Patent Specification No. 1,314,449 a circuit of the abovementioned kind is known in which a signal corresponding to a periodically occurring series of comparison numbers is supplied to the comparator and in which each comparison number is a mirror image of a number of a monotonously increasing or decreasing series numbers which each time decrease or increase in value by a step of one. Then the comparator delivers a signal in which the number of pulses per period increases by the value of the digital number which corresponds to the digital signal until the digital number has reached half of its maximum convertible value.

Therefore such a circuit delivers a pulse signal which can be easily converted to an analog signal as the number of pulses per period increases by the value of the digital number to be converted. However, it was found that this increase is accompanied by an increase in the absolute value of the error in the conversion, until the value of the digital number to be converted has obtained half of its convertible maximum value.

The object of the present invention is to greatly reduce the error in the conversion and a circuit of the kind described above is therefore characterized in that the generator is suitable for the generation of a signal that corresponds to a series of digital comparison numbers of which in each next comparison number ($C = C_{n-1} \ldots C_O$) the most significant first $m$ figures ($C_{n-1} \ldots C_{n-m}$) pass through a series of numbers ($D = D_{n-1} \ldots D_O$) which each time monotonously increase or decrease in value by one, whereas the least significant last ($n - m$) figures form a digital number ($E = E_{n-1} \ldots E_O$) whose figures form an inversion of the order of the figures of a number ($B_{n-1} \ldots B_m$) of ($n - m$) figures, which each time increases or decreases respectively by one, when the number series ($C_{n-1} \ldots C_{n-m}$) of the first $m$ figures, reckoned in the order of decreasing significance of the comparison number (C), has been passed through, with the condition that $n \geq 3$, $m \neq 1$ and $m \neq n$.

This ensures that the number of pulses per period can only increase to $2^{n-m}$ so that the number of pulse edges which produce the abovementioned error in the conversion remain limited. An added advantage is that temperature variations which affect the shape of the pulse edges now have a less disturbing influence in the conversion.

A circuit according to the invention is particularly suitable for use in a tuning circuit of a receiver such as for example television receiver. In such a circuit as a rule the analog signal values corresponding to a digital number smaller than $2^{n-m}$, which continue to show the largest relative error, are usually not used.

The invention will now be described with reference to the drawing.

FIG. 1 of the drawing shows a block diagram of a converter circuit according to the invention.

Figure 2:
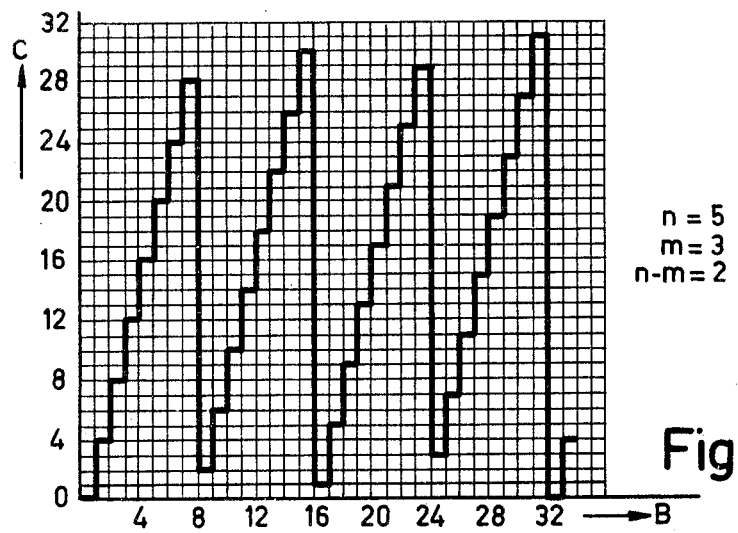
Figure 3:
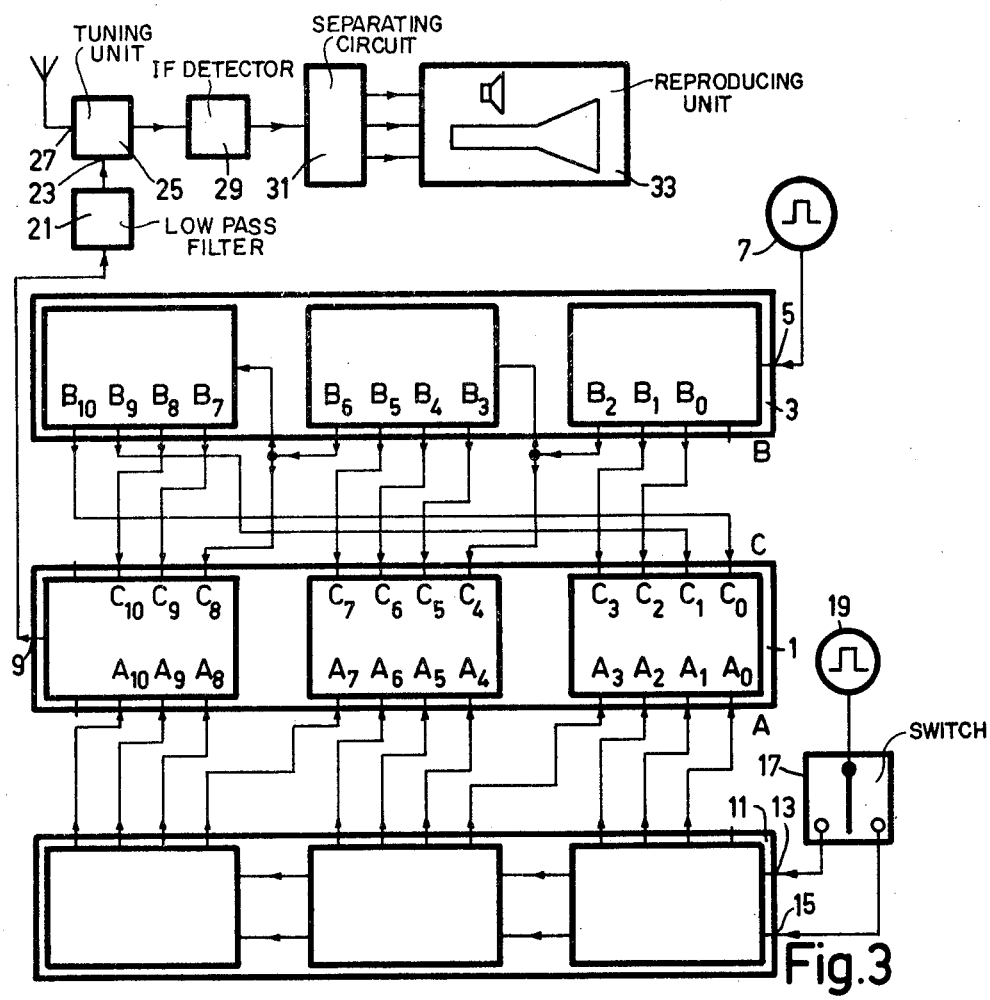

FIG. 2 is a graph showing how the digital comparison number C varies as a function of the counter position B, and FIG. 3 shows a block diagram of a television receiver having a circuit according to the invention.

In FIG. 1 there is supplied to a comparator 1 a signal combination which corresponds to a digital number $A = A_{n-1} \ldots A_O$ to be converted, namely to an input $A_O$ a signal corresponding to the least significant figure A, to an output $A_1$ a signal corresponding to the, in significance, next figure $A_1$ and so on.

Also supplied to the comparator is a signal combination corresponding to a digital comparison number $C = C_{n-1} \ldots C_O$ which is supplied by a counter 3 whose position $B = B_{n-1} \ldots B_O$ produces a signal combination of signals which correspond to the figures $B_O$, $B_1$ and so on. To an input 5 of the counter 3 pulses are continuously supplied which are generated by a pulse generator 7. Each pulse causes the counter to advance by one position.

To avoid intricate formulae, hereinafter the indications for figures and numbers and the corresponding signals and signal combinations will be intermingled.

The comparator 1 has an output 9 at which an analog signal appears which can be converted by means of a low-pass filter to an analog signal corresponding to the signal combination $A_{n-1} \ldots A_O$.

For example the output 9 can become high when $C \leq A$ and remain low when $C > A$.

In the comparator 1 $C_O$ is compared to $A_O$, $C_1$ to $A_1$ and so on. The figures of the comparison number C are derived from the figures of the counter position B in the following manner:

The first, least significant figure $B_O$ of B is the figure $C_{n-m}$ of C, which figure is the $(n-m+1)^{th}$ figure in sequence of increasing significance of C; the second figure $B_1$ of B, reckoned in sequence of increasing significance, is the $(n-m+2)^{th}$ figure $C_{c-m+1}$ of C and the $m^{th}$ figure $B_{m-1}$ of B is the $n^{th}$ figure $C_{n-1}$ of $C_1$. Here $n$ is the number of figures of the numbers A, B and C and $m$ has a value which is to be adapted to the purposes for which the circuit is intended. The next figures of B, i.e. the $(m+1)^{th}$ figure $B_m$, the $(m+2)^{th}$ figure $B_{m+1}$ to the last, most significant $n^{th}$ figure $B_{n-1}$, form in the mirror image sequence the first $(n-m)$ figures $C_O$, $C_1 \ldots C_{n-m-1}$ of C. Thus $C_O = B_{n-1}$, $C_1 = B_{n-2}, \ldots, C_{n-m-2} = B_{m+1}$ and $C_{n-m-1} = B_m$.

The $m$ most significant figures of C, which are the least significant figures of B, form a number $D = D_{m-1}, C_{m-2}, \ldots D_O$ which increases (or decreases when the counter 3 counts down) monotonously in value when the counter 3 passes through its positions in which jumps occur at the transitions of $11 \ldots 1$ to $00 \ldots 0$. The $(n-m)$ least significant figures of C form a number $E = E_{n-m-1}, E_{n-m-2}, \ldots E_O$ whose value changes in a more intricate manner because it is a mirror image of the sequence of a number $B_{n-1}, \ldots B_m$ which each time increases by one when the number series $B_{m-1}, \ldots B_O = D_{m-1}, \ldots D_O$ has been passed through.

The table below shows for $n = 5$ and $m = 3$ an example of the relation between the various figures and numbers and in FIG. 2 between the values of the counter position B and those of the comparison number C.

TABLE

| Counter Position | | Comparison number | | | |
|---|---|---|---|---|---|
| | | $C_4C_3C_2C_1C_0$ | | | |
| | | $D_2D_1D_0E_1E_0$ | | | |
| B | $B_4B_3B_2B_1B_0$ | $B_2B_1B_0B_3B_4$ | C | D | E |
| 0 | 00000 | 00000 | 0 | 0 | 0 |
| 1 | 00001 | 00100 | 4 | 1 | 0 |
| 2 | 00010 | 01000 | 8 | 2 | 0 |
| 3 | 00012 | 01100 | 12 | 3 | 0 |
| 4 | 00100 | 10000 | 16 | 4 | 0 |
| 5 | 00101 | 10100 | 20 | 5 | 0 |
| 6 | 00110 | 11000 | 24 | 6 | 0 |
| 7 | 00111 | 11100 | 28 | 7 | 0 |
| 8 | 01000 | 00010 | 2 | 0 | 2 |
| 9 | 01001 | 00110 | 6 | 1 | 2 |
| 10 | 01010 | 01010 | 10 | 2 | 2 |
| 11 | 01011 | 01110 | 14 | 3 | 2 |
| 12 | 01100 | 10010 | 18 | 4 | 2 |
| 13 | 01101 | 10110 | 22 | 5 | 2 |
| 14 | 01110 | 11010 | 26 | 6 | 2 |
| 15 | 01111 | 11110 | 30 | 7 | 2 |
| 16 | 10000 | 00001 | 1 | 0 | 1 |
| 17 | 10001 | 00101 | 5 | 1 | 1 |
| 18 | 10010 | 01001 | 9 | 2 | 1 |
| 19 | 10011 | 01101 | 13 | 3 | 1 |
| 20 | 10100 | 10001 | 17 | 4 | 1 |
| 21 | 10101 | 10101 | 21 | 5 | 1 |
| 22 | 10110 | 11001 | 25 | 6 | 1 |
| 23 | 10111 | 11101 | 29 | 7 | 1 |
| 24 | 11000 | 00011 | 3 | 0 | 3 |
| 25 | 11001 | 00111 | 7 | 1 | 3 |
| 26 | 11010 | 01011 | 11 | 2 | 3 |
| 27 | 11011 | 01111 | 15 | 3 | 3 |
| 28 | 11100 | 10011 | 19 | 4 | 3 |
| 29 | 11101 | 10111 | 23 | 5 | 3 |
| 30 | 11110 | 11011 | 27 | 6 | 3 |
| 31 | 11111 | 11111 | 31 | 7 | 3 |

The figure shows that for A = 0 a high value of the output signal of the comparator will occur at the counter position B = 0, for A = 1 at the counter positions B = 0 and B = 16, for A = 2 at the counter position B = 0, B = 8 and B = 16, for A = 3 at the counter positions B = 0, B = 8, B = 16 and B = 24. When the values A are still higher a number of pulses per counter cycle at the output 9 of the comparator does no longer increase, but the width of the pulses increases so that the number of pulse edges does no longer increase. These pulse edges are the cause of errors in the conversion which are, besides, temperature dependent. These errors are now limited because the number of pulses per counter cycle remains limited to $2^{n-m}$. The increase of the frequency of the output signal at an increase in value of A from 0 is favorable for the choice of the values of the components of the low-pass filter mentioned above, following the comparator.

In FIG. 3 the same reference numerals have been used as in FIG. 1 for corresponding components.

The comparator 1 comprises three integrated 4-bit magnitude comparator circuits of the type SN 7485 and the counter 3 comprises three integrated 4-bits counter circuits SN 7493.

The digital number A to be converted is delivered by a two-way counter 11 which comprises three integrated 4-bits counter circuits SN S84193. This counter 11 has an upcounting input 13 and a downcounting input 15 which are connected to a switch 17, whose other side is connected to an output of a pulse generator 19. By operating the switch 17 the position of the counter 11 can be increased or decreased whereby the output signal of a comparator 1 delivers a pulse pattern which corresponds to that position and which is converted by a low pass filter 21 to a direct voltage which is supplied to a tuning unit 25.

The tuning unit 25 has an input 27 to which a signal received is fed. To an intermediate frequency detector 29 an I.F. signal is supplied which is determined by the tuning of the tuning unit 25. The intermediate frequency and detector unit 29 then supplies a signal to a separating circuit 31 which delivers sound, picture and synchronization signals to reproducing unit 33.

For the counters 3 and 11 and the comparator 1 $m = 9$ and $n = 11$ has been chosen. The maximum number of pulses which appear at the output 9 of comparator 1 per cycle of the counter 3 then is $2^{n-m} = 2^2 = 4$.

The output voltage of the filter 21 may have $2^n = 2^{11} = 2048$ steps.

$C_O$ of the comparator is connected to $B_{10}$, of the counter C, to $B_9$, $C_2$ to $B_O$, $C_3$ to $B_1$, $C_4$ to $B_2$, $C_5$ to $B_3$, $C_6$ to $B_4$, $C_7$ to $B_5$, $C_8$ to $B_6$, $C_9$ to $B_7$, and $C_{10}$ to $B_8$.

It will be clear that the comparator 1 may also be in the form of a half-adder as described in the abovementioned British Patent.

Furthermore it is of course possible to use for the supply of the comparison members C a conventional counter 3, connected in a special manner which supplies the desired signal C at its output, in which case special gate circuits for the counter sections are then required. A shift register, having a special feedback, can also be used.

If desired a signal corresponding to a binary coded decimal number can also be converted to an analog signal in a manner which corresponds to a manner indicated in the British Patent.

In the extreme case that $n-m = 1$ is chosen the sequence inversion mentioned is of no practical significance. It will be clear that $m \neq n$ and $m > 1$ must be chosen and $n \leq 3$.

For $n - m = 1$ the circuit of FIG. 1 delivers a maximum of two output pulses per counter cycle.

What is claimed is:

1. A tuning system comprising
a circuit for the conversion of a digital signal to an analog signal comprising a comparator and a generator, said comparator having inputs for comparing the value of the digital signal which corresponds to a digital number ($A = A_{n-1} \ldots A_O$) to be converted, to the value of a digital comparison signal which corresponds to a periodically occurring series of n-digit comparison numbers ($C = C_{n-1} \ldots C_O$) produced by said generator, and an output; said generator being connected to said comparator and adapted for the generation of a signal that corresponds to a series of digital comparison numbers of which for each subsequent comparison number ($C = C_{n-1} \ldots C_O$) the most significant first $m$ digits ($C_{n-1} \ldots C_{n-m}$) count through a series of numbers ($D = D_{m-1} \ldots D_O$) each of which numbers monotonically increases or decreases each time in value by one and corresponds to the m-counter digits of a number ($B_{m-1} \ldots B_O$), the least significant ($n-m$) digits of said comparison number forming a digital number ($E = E_{n-m-1} \ldots E_O$) whose digits form an inverted order of the digits of a number ($B_{n-1} \ldots B_m$) of ($n-m$) digits, which each time increases or decreases respectively by one when the number series ($C_{n-1} \ldots C_{n-m}$) of the first $m$ figures, reckoned in sequence of decreasing significance of the comparison number (C), has been counted through, with the condition that $n \geq 3$, $m \neq 1$, $m \neq n$, $n$ and $m$ be positive integers;

a low pass filter having an input connected to said output of said comparator and an output; and a tuning unit connected to the output of said low pass filter.

2. A system as claimed in claim 1, wherein the generator is a counter whose first figure ($B_0$) reckoned in sequence of increasing significance of the position of the counter output ($B = B_{n-1} \ldots B_0$) is compared in the comparator to the $(m + 1)^{th}$ figure ($A_{n-m}$) reckoned in the direction of increasing significance of a digital number (A) to be converted, the second figure ($B_1$) of the counter position (B) is compared to the $(m + 2)^{th}$ figure ($A_{n-m+1}$) of the digital number (A) to be converted and so on, the $m^{th}$ figure ($B_{m-1}$) of the counter position (B) to the $n^{th}$ figure ($A_{n-1}$) of the digital number (A) to be converted, the $(m + 1)^{th}$ figure ($B_m$) of the counter position (B) to the $(n-m)^{th}$ figure ($A_{n-m-1}$) of the digital number (A)₁, the $(n-m+1)^{th}$ figure ($B_{m+1}$) of the counter position (B) to the $(n-m-2)^{th}$ figure ($A_{n-m}$) of the digital number (A) and so on, so that the $n^{th}$ figure ($B_{n-1}$) of the counter position is compared to the first figure ($A_0$) of the digital number to be converted.

* * * * *